United States Patent
Fukuda et al.

(10) Patent No.: US 9,571,210 B2
(45) Date of Patent: Feb. 14, 2017

(54) SIGNAL PROCESSING DEVICE, SIGNAL PROCESSING METHOD, AND RECEIVING DEVICE

(75) Inventors: Shinichi Fukuda, Kanagawa (JP); Hiroaki Nakano, Tokyo (JP)

(73) Assignee: Sony Corporation, Tokyo (JP)

( * ) Notice: Subject to any disclaimer, the term of this patent is extended or adjusted under 35 U.S.C. 154(b) by 139 days.

(21) Appl. No.: 13/985,442

(22) PCT Filed: Feb. 14, 2012

(86) PCT No.: PCT/JP2012/053437
§ 371 (c)(1),
(2), (4) Date: Aug. 14, 2013

(87) PCT Pub. No.: WO2012/114948
PCT Pub. Date: Aug. 30, 2012

(65) Prior Publication Data
US 2013/0316655 A1    Nov. 28, 2013

(30) Foreign Application Priority Data

Feb. 21, 2011 (JP) .................................. 2011-034580

(51) Int. Cl.
*H04L 27/02*    (2006.01)
*H04B 17/00*    (2015.01)
(Continued)

(52) U.S. Cl.
CPC ............... *H04B 17/00* (2013.01); *H03D 1/10* (2013.01); *H04B 5/0031* (2013.01); *H04B 5/0081* (2013.01); *H04B 5/02* (2013.01)

(58) Field of Classification Search
CPC ........... H02J 3/386; H04B 5/0025; H04B 5/00
See application file for complete search history.

(56) References Cited

U.S. PATENT DOCUMENTS 4,112,384 A * 9/1978 Buchberger .................. 330/141
4,245,348 A * 1/1981 Imazeki ..................... 455/154.2
(Continued)

FOREIGN PATENT DOCUMENTS

JP    2001-307031 A    11/2001
JP    2004-102404 A    4/2004
(Continued)

*Primary Examiner* — Cindy Trandai
(74) *Attorney, Agent, or Firm* — Chip Law Group

(57) ABSTRACT

This disclosure relates to a signal processing device, a signal processing method, and a receiving device that are capable of detecting response information at a high degree of accuracy from a carrier signal that is load-modulated based on the response information. A positive DC generating unit 61 generates a positive threshold based on a load-modulated carrier signal. A positive selecting unit 62 compares the voltage of the carrier signal with the positive threshold, and outputs the value of the larger one to an adding unit 65. A negative DC generating unit 63 generates a negative threshold based on the load-modulated carrier signal. A negative selecting unit 64 compares the voltage of the carrier signal with the negative threshold, and outputs the value of the smaller one to the adding unit 65. The adding unit 65 adds the output of the positive selecting unit 62 and the output of the negative selecting unit 64, and outputs the addition result to an IQ detecting unit 53. As a result of the combining, a signal that has smaller Vpp than that of the original carrier signal and maintains the fluctuation portions of the voltage is obtained. This disclosure can be applied to non-contact communication systems.

6 Claims, 20 Drawing Sheets

(51) Int. Cl.
*H04B 5/00* (2006.01)
*H04B 5/02* (2006.01)
*H03D 1/10* (2006.01)

(56) References Cited

U.S. PATENT DOCUMENTS

| | | | | |
|---|---|---|---|---|
| 4,859,937 | A * | 8/1989 | Milkovic | H03K 7/08 324/142 |
| 5,936,578 | A * | 8/1999 | Driessen et al. | 342/374 |
| 6,031,369 | A * | 2/2000 | Trontelj | G01R 21/133 324/111 |
| 7,411,831 | B2 * | 8/2008 | Kawajiri | G11C 16/12 365/185.18 |
| 7,469,127 | B2 | 12/2008 | Takiguchi | |
| 7,912,441 | B2 * | 3/2011 | Von Bosch | H04M 1/7253 455/343.1 |
| 9,030,052 | B2 * | 5/2015 | Kim | H04B 5/0031 307/104 |
| 2002/0008612 | A1 * | 1/2002 | Wuidart | G06K 7/0008 340/10.4 |
| 2002/0158191 | A1 * | 10/2002 | Graves | H04B 10/25133 250/227.23 |
| 2003/0062885 | A1 * | 4/2003 | Ballan | H03G 3/345 324/76.28 |
| 2004/0044713 | A1 * | 3/2004 | Healey | H03H 21/0012 708/322 |
| 2004/0075462 | A1 * | 4/2004 | Kizer | H03K 5/1565 326/29 |
| 2004/0180637 | A1 * | 9/2004 | Nagai | G06K 19/0723 455/127.1 |
| 2004/0203982 | A1 * | 10/2004 | Barak et al. | 455/522 |
| 2006/0049244 | A1 * | 3/2006 | Hayakawa | G06K 7/0008 235/382 |
| 2006/0222109 | A1 * | 10/2006 | Watanabe et al. | 375/324 |
| 2006/0238301 | A1 * | 10/2006 | Wu | G06K 7/0008 340/10.1 |
| 2007/0045418 | A1 * | 3/2007 | Charrat | G06K 7/0008 235/451 |
| 2007/0212596 | A1 * | 9/2007 | Nebrigic | H01M 10/44 429/61 |
| 2007/0246546 | A1 * | 10/2007 | Yoshida | G06K 7/0008 235/492 |
| 2007/0274242 | A1 * | 11/2007 | Lamacraft | G06K 19/0723 370/310 |
| 2008/0030336 | A1 | 2/2008 | Endo et al. | |
| 2008/0164941 | A1 * | 7/2008 | Lee | H03F 3/195 330/124 R |
| 2009/0040796 | A1 * | 2/2009 | Lalithambika | H02M 3/33507 363/21.17 |
| 2009/0108805 | A1 * | 4/2009 | Liu | H01F 38/14 320/108 |
| 2009/0141826 | A1 * | 6/2009 | Suzuki et al. | 375/295 |
| 2009/0219138 | A1 * | 9/2009 | Forster | G06K 19/0723 340/10.1 |
| 2010/0054325 | A1 * | 3/2010 | Sjostrom | H03F 3/217 375/238 |
| 2011/0011934 | A1 * | 1/2011 | Iwamura | G06K 19/0701 235/435 |
| 2011/0130106 | A1 * | 6/2011 | Nagayama et al. | 455/127.2 |
| 2012/0049949 | A1 * | 3/2012 | Nito | H03K 5/082 329/300 |
| 2012/0118974 | A1 * | 5/2012 | Germaine et al. | 235/462.27 |
| 2012/0134448 | A1 * | 5/2012 | Fukuda | H04L 27/06 375/340 |

FOREIGN PATENT DOCUMENTS

| | | |
|---|---|---|
| JP | 2006-074579 A | 3/2006 |
| JP | 2008-061218 A | 3/2008 |

* cited by examiner

30

SIGNAL PROCESSING DEVICE, SIGNAL PROCESSING METHOD, AND RECEIVING DEVICE

CROSS-REFERENCE TO RELATED APPLICATION

The present application is a national phase entry under 35 U.S.C. §371 of International Application No. PCT/JP2012/053437 filed Feb. 14, 2012, published on Aug. 30, 2012 as WO 2012/114948 A1, which claims priority from Japanese Patent Application No. JP 2011-034580 filed in the Japanese Patent Office on Feb. 21, 2011.

TECHNICAL FIELD

This disclosure relates to signal processing devices, signal processing methods, and receiving devices, and more particularly, to a signal processing device, a signal processing method, and a receiving device that are suitable in cases where response information is detected from a carrier signal load-modulated based on transmission information, for example.

BACKGROUND ART

Non-contact communication systems, such as FeliCa (a registered trademark of Sony Corporation), are widely used today. Such non-contact communication systems are employed in the ticket gate systems for public transportation such as trains and buses, and the electronic money systems that can be used at various kinds of shops and vending machines.

FIG. 1 shows an example structure of a conventional non-contact communication system. This non-contact communication system 10 is formed with a reader/writer 11 and a transponder 12. In a case where this non-contact communication system 10 is employed at a ticket gate of a train station, for example, the reader/writer 11 is installed in the ticket gate, and the transponder 12 is embedded in an IC card serving as a ticket, such as Suica (a trademark).

In a case where predetermined transmission information is transmitted from the reader/writer 11 to the transponder 12, a sinusoidal carrier signal (a carrier wave) like the signal shown in A of FIG. 2 is ASK (amplitude shift keying)-modulated and transmitted in accordance with the transmission information. In a case where predetermined digitized response information like the information shown in B of FIG. 2 is transmitted from the transponder 12 to the reader/writer 11, on the other hand, load modulation is performed to cause changes in the voltage of the carrier signal as shown in C of FIG. 2 by switching on and off a damping resistor R1 in the transponder 12 with a switch in accordance with the predetermined response information (see Patent Document 1, for example).

The load-modulated carrier signal is then received by an antenna of the reader/writer 11. The received load-modulated carrier signal has its degree of modulation lowered in accordance with the distance between the reader/writer 11 and the transponder 12, as shown in D of FIG. 2. As the degree of modulation becomes lower, detection of the response information becomes more difficult.

In a case where the non-contact communication system 10 is used in a ticket gate at a train station or the like, to ensure user friendliness, it is required that communication should be possible even if the distance between the reader/writer 11 and the antenna of the transponder 12 is 10 cm or longer.

If the distance between the reader/writer 11 and the transponder 12 becomes longer, the degree of modulation of a load-modulated carrier signal becomes lower, and detection of response information becomes difficult as described above. To compensate for that, the peak-to-peak voltage (hereinafter referred to as Vpp) of the carrier signal is increased to approximately 20 V.

FIG. 3 shows an example structure of a conventional reader/writer that can be used in a case where Vpp of the carrier signal is 20 V. This reader/writer 20 detects response information based on amplitude changes in the voltage of a load-modulated carrier signal.

In the reader/writer 20, full-wave rectification is performed on the load-modulated carrier signal, and envelope detection is performed on the carrier signal by a peak holding circuit that outputs a detection signal. For example, in the case of a carrier signal load-modulated to a modulation degree of 10% as shown in A of FIG. 4, full-wave rectification is performed as shown in B of FIG. 4, and a detection signal with a 1 V difference is output as shown in C of FIG. 4.

CITATION LIST

Patent Document

Patent Document 1: JP 2001-307031 A

SUMMARY OF THE INVENTION

Problems to be Solved by the Invention

As described above, the conventional reader/writer 20 detects response information as amplitude changes in the voltage of a carrier signal. Therefore, when the degree of modulation of the carrier signal becomes lower, response information cannot be accurately detected.

Meanwhile, it is known that, in a case where a carrier signal is load-modulated based on response information at the transponder, the load modulation not only causes amplitude changes in the voltage of the carrier signal, but also causes changes in the phase of the voltage. With the characteristics being taken advantage of, an IQ detector (a quadrature detector) that can detect both amplitude changes and phase changes in voltage is used in the reader/writer.

A conventional IQ detector is often used in a 50Ω system that processes high-frequency signals, and the highest allowable Vpp of input carrier signals is as low as 2 V in most conventional IQ detectors.

As described above, Vpp of carrier signals is set at approximately 20 V. Therefore, to use a conventional IQ detector in the reader/writer, an attenuator that attenuates Vpp of a carrier signal to 1/10 of the original value is provided in the stage before the conventional IQ detector, for example, as shown in FIG. 5. In this case, a carrier signal having Vpp attenuated by the attenuator has an amplitude difference of 0.1 V in the voltage, and only a difference of 0.1 V is caused in the detection signal to be output from the IQ detector, as shown in FIG. 6. As a result, the detection sensitivity of the reader/writer 30 to response information might become lower.

This disclosure is being made in view of those circumstances, and an object thereof is to detect response information with high accuracy from a carrier signal that is load-modulated based on the response information.

Solutions to Problems

A signal processing device as a first aspect of this disclosure includes: a positive detecting unit that detects a positive amplitude fluctuation portion of the voltage of a load-modulated carrier signal; a negative detecting unit that detects a negative amplitude fluctuation portion of the voltage of the carrier signal; and a combining unit that combines the positive amplitude fluctuation portion and the negative amplitude fluctuation portion of the voltage of the carrier signal.

The positive detecting unit may include a first generating unit that generates a positive threshold of the voltage of the carrier signal, and a first selecting unit that compares the voltage of the carrier signal with the positive threshold, and selects the value of the larger one. The negative detecting unit may include a second generating unit that generates a negative threshold of the voltage of the carrier signal, and a second selecting unit that compares the voltage of the carrier signal with the negative threshold, and selects the value of the smaller one.

The signal processing device as the first aspect of this disclosure may further include a shaping unit that shapes the waveform of the result of the combining of the positive amplitude fluctuation portion and the negative amplitude fluctuation portion into a sinusoidal wave.

A signal processing method as the first aspect of this disclosure is a signal processing method for a signal processing device that attenuates the voltage of a load-modulated carrier signal. The signal processing method includes: a positive detecting step of detecting a positive amplitude fluctuation portion of the voltage of the carrier signal; a negative detecting step of detecting a negative amplitude fluctuation portion of the voltage of the carrier signal; and a combining step of combining the positive amplitude fluctuation portion and the negative amplitude fluctuation portion of the voltage of the carrier signal, the steps being carried out by the signal processing device.

In the first aspect of this disclosure, a positive amplitude fluctuation portion of the voltage of a carrier signal is detected, a negative amplitude fluctuation portion of the voltage of the carrier signal is detected, and the positive amplitude fluctuation portion and the negative amplitude fluctuation portion of the voltage of the carrier signal are combined.

A receiving device as a second aspect of this disclosure includes: a receiving unit that receives a load-modulated carrier signal; a positive detecting unit that detects a positive amplitude fluctuation portion of the voltage of the load-modulated carrier signal; a negative detecting unit that detects a negative amplitude fluctuation portion of the voltage of the carrier signal; a combining unit that combines the positive amplitude fluctuation portion and the negative amplitude fluctuation portion of the voltage of the carrier signal; and a detecting unit that detects the result of the combining of the positive amplitude fluctuation portion and the negative amplitude fluctuation portion.

The receiving device as the second aspect of this disclosure may further include a shaping unit that shapes the waveform of the result of the combining of the positive amplitude fluctuation portion and the negative amplitude fluctuation portion into a sinusoidal wave. In this receiving device, the detecting unit may detect the result of the combining shaped into a sinusoidal wave.

In the second aspect of this disclosure, a load-modulated carrier signal is received, a positive amplitude fluctuation portion of the voltage of the carrier signal is detected, a negative amplitude fluctuation portion of the voltage of the carrier signal is detected, the positive amplitude fluctuation portion and the negative amplitude fluctuation portion are combined, and the result of the combining is detected.

Effects of the Invention

According to the first aspect of this disclosure, the degree of modulation of amplitude changes of a carrier signal that is load-modulated based on response information can be increased.

According to the second aspect of this disclosure, response information can be detected with high accuracy from a received carrier signal that is load-modulated based on the response information.

MODES FOR CARRYING OUT THE INVENTION

The following is a detailed description of best modes (hereinafter referred to as embodiments) for carrying out the invention, with reference to the drawings.

Outline of This Disclosure

Figure 5:
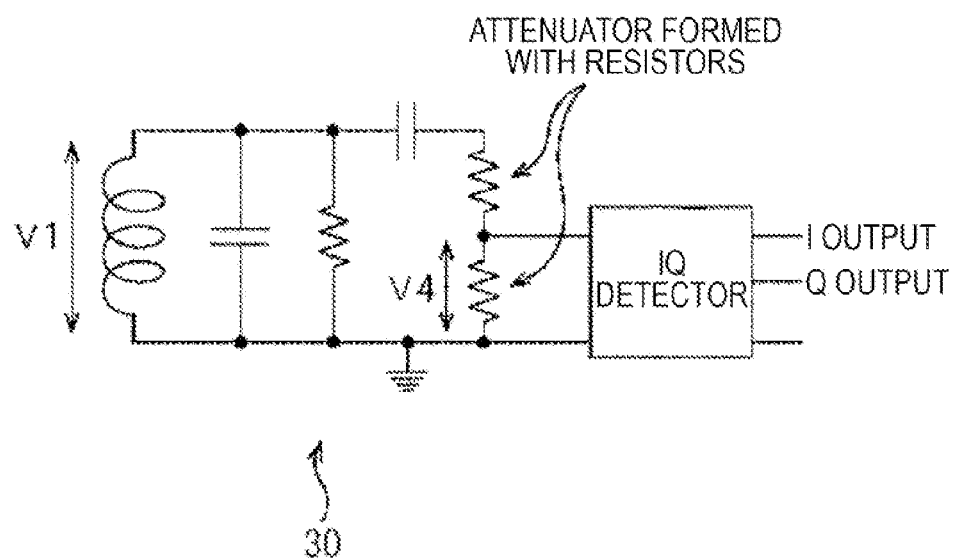
FIG. 5 is a circuit diagram showing an example structure of a reader/writer including an attenuator and a conventional IQ detector.
Figure 6:
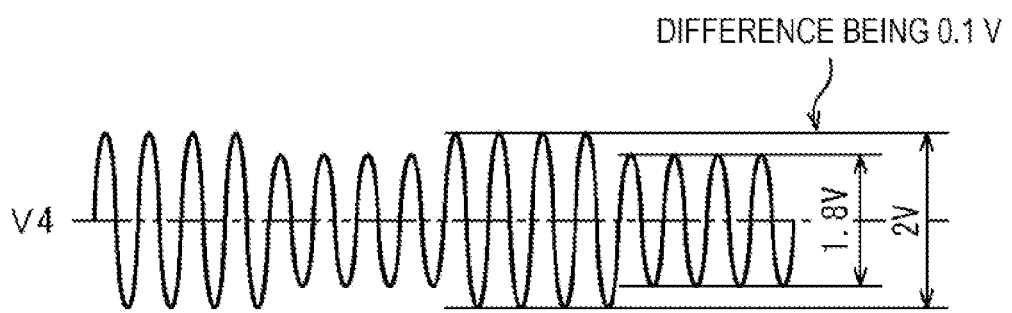
FIG. 6 is a diagram showing amplitude changes in the voltage of an attenuated carrier signal that is input to the IQ detector in the reader/writer shown in FIG. 5.
Figure 7:
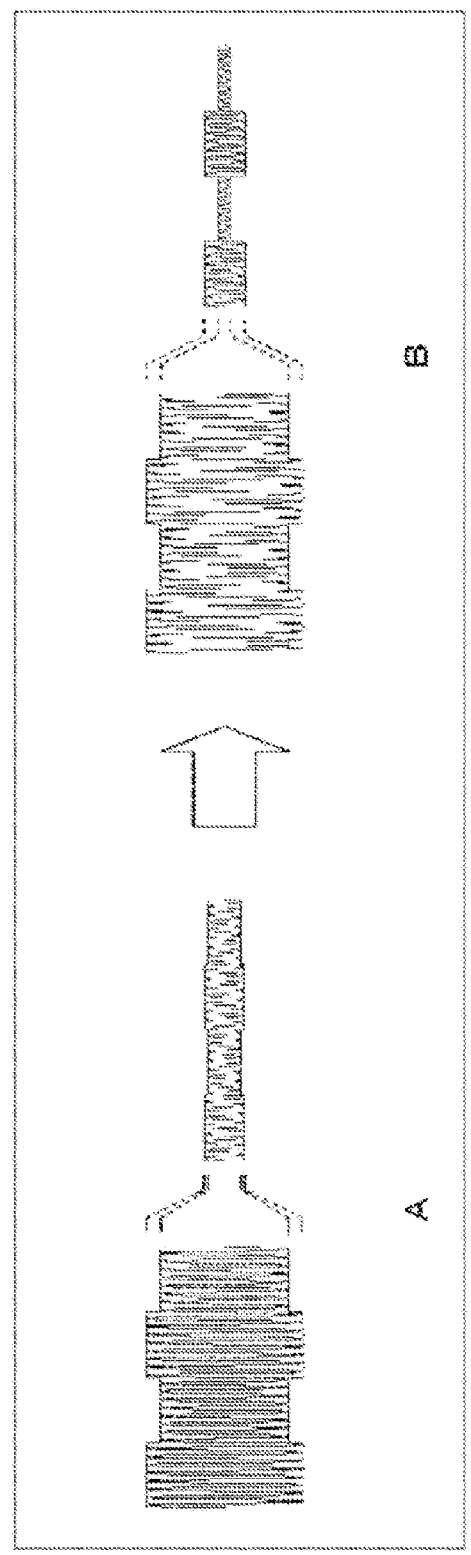
FIG. 7 is a diagram for comparing a case where Vpp of a carrier signal is attenuated by the conventional attenuator shown in FIG. 5 with a case where Vpp of a carrier signal is attenuated by a modulation adjusting unit of this disclosure.

First, the outline of this disclosure is described. FIG. 7 shows the difference between a case where Vpp of a carrier signal that is load-modulated based on response information is attenuated by the conventional attenuator shown in FIG. 5 (A in the drawing), and a case where Vpp of a carrier signal that is load-modulated based on response information is attenuated by a modulation adjusting unit 52 (FIG. 9) of this disclosure (B in the drawing).

In the case where Vpp of a load-modulated carrier signal is attenuated by the conventional attenuator, the amplitude of the voltage is compressed overall as shown in A in the drawing. As a result, the amplitude change caused by response information or the degree of modulation of the carrier signal is reduced, and the accuracy of response information detection becomes lower. In view of this, this disclosure suggests a technique for attenuating Vpp of a carrier signal without a decrease in the degree of modulation of the carrier signal as shown in B in the drawing.

Figure 8:
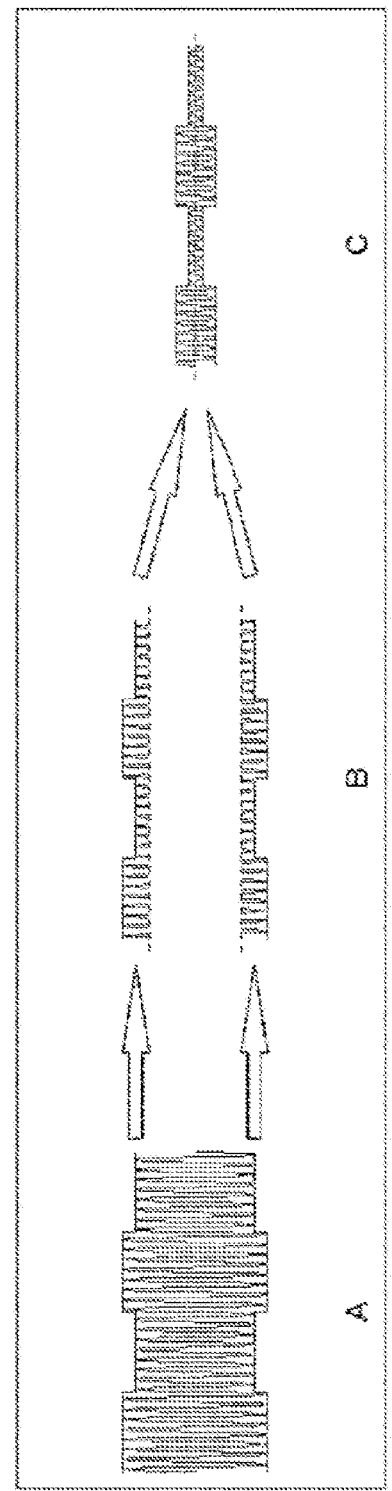
FIG. 8 is a diagram illustrating a technique attenuating Vpp without a decrease in the degree of modulation of the carrier signal.

FIG. 8 specifically illustrates this technique. The midpoint potential portion that is not affected by response information is removed from a pre-attenuation load-modulated carrier signal shown in A in the drawing, and a positive amplitude fluctuation portion and a negative amplitude fluctuation portion that are the amplitude change components of the voltage affected by response information are detected, as shown in B in the drawing. Further, the positive amplitude fluctuation portion and the negative amplitude fluctuation portion that are affected by response information are added to each other, as shown in C in the drawing.

In this manner, a carrier signal that has Vpp attenuated but maintains the amplitude change components to be affected by response information (with the degree of modulation relatively increased) can be obtained. Accordingly, response information can be detected with a higher degree of accuracy by detecting this attenuated carrier signal.

Embodiment

Example Structure of a Reader/Writer

Figure 9:
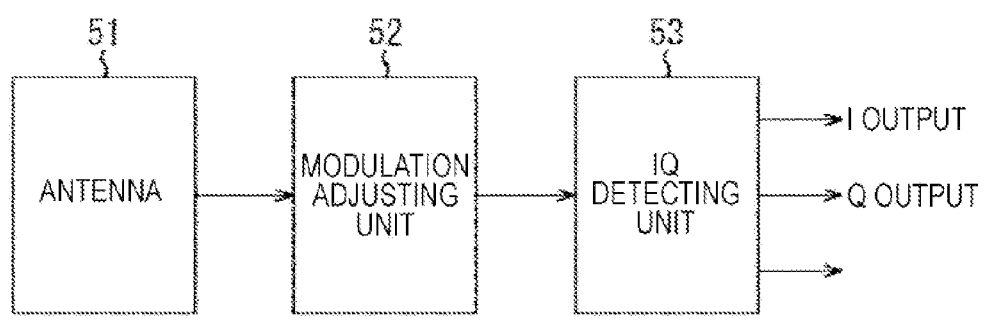
FIG. 9 is a block diagram showing an example structure of a reader/writer as an embodiment.

FIG. 9 shows an example structure of a reader/writer as an embodiment in this disclosure.

Figure 1:
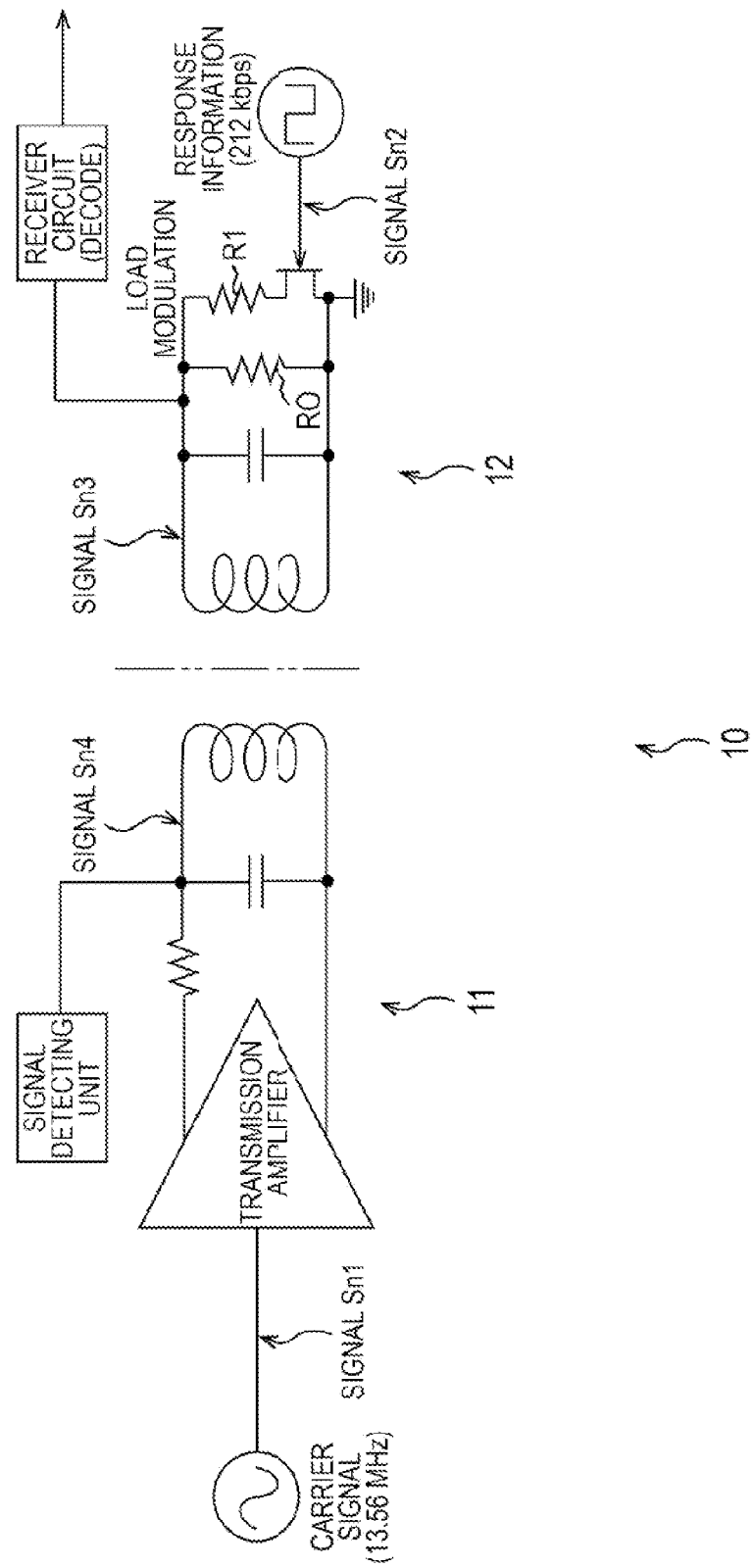
FIG. 1 is a circuit diagram showing an example structure of a conventional non-contact communication system.
Figure 2:
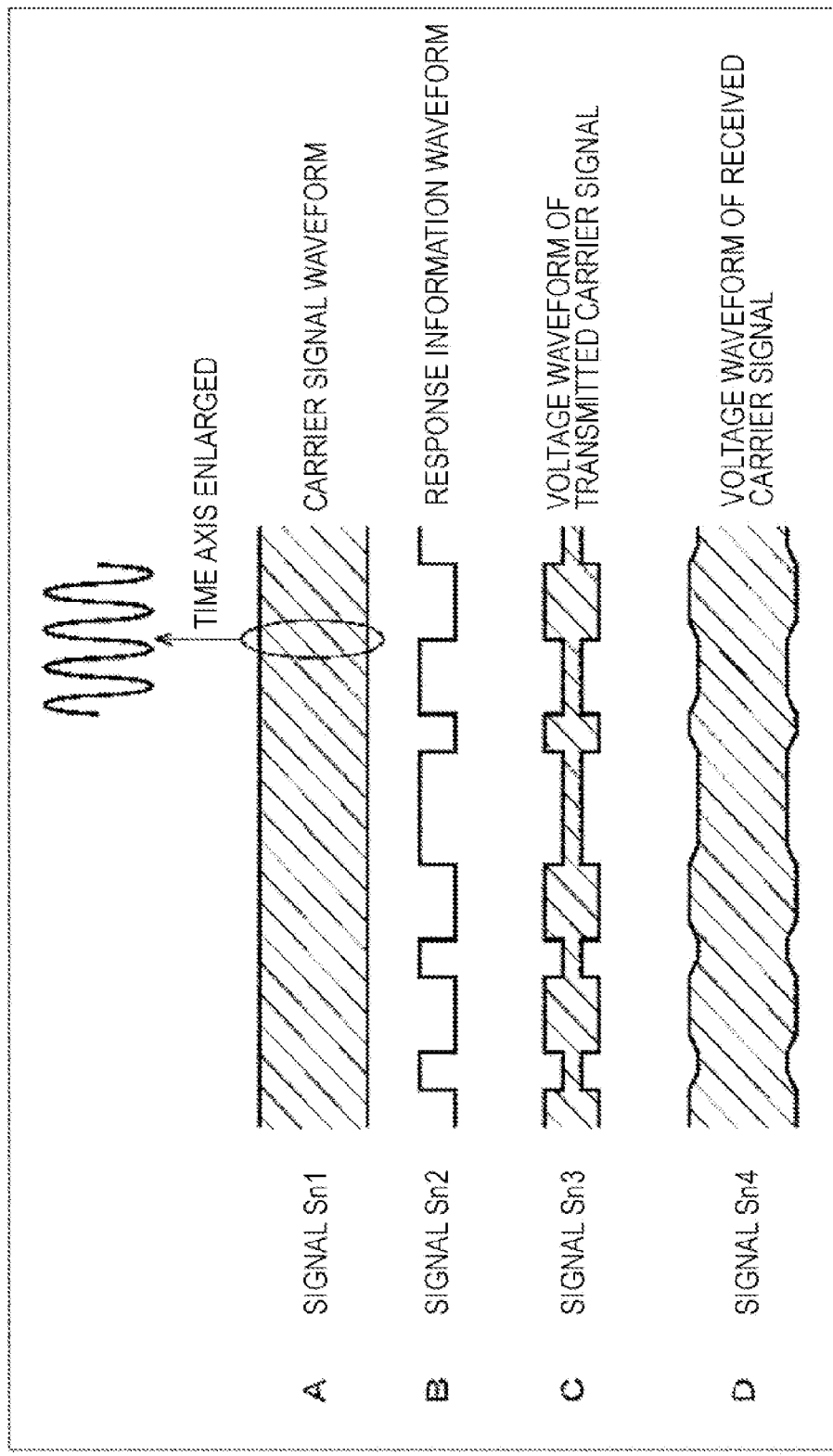
FIG. 2 is a diagram for explaining changes in the degree of modulation of a load-modulated carrier signal.
Figure 3:
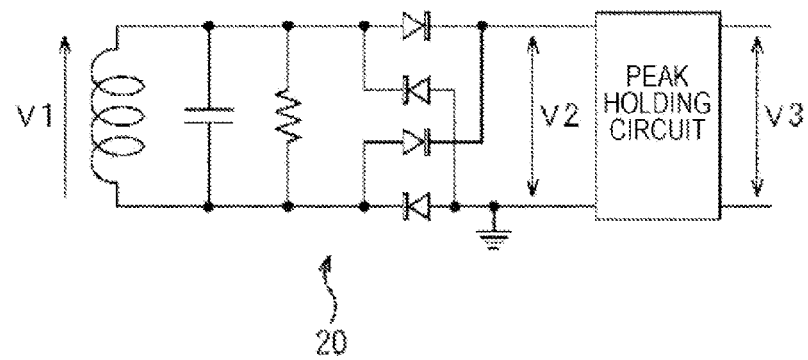
FIG. 3 is a circuit diagram showing an example structure of a conventional reader/writer that detects amplitude changes in the voltage of a load-modulated carrier signal.
Figure 4:
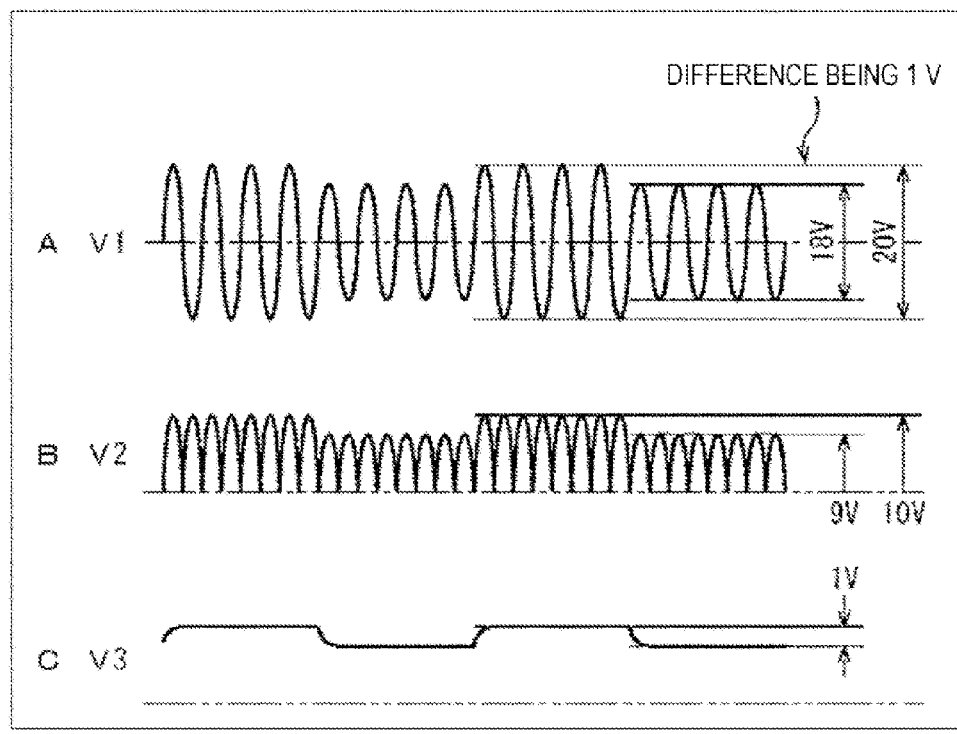
FIG. 4 is a diagram showing a detection signal to be output from the reader/writer shown in FIG. 3.

This reader/writer 50 is used in a non-contact communication system as shown in FIG. 1, for example. The reader/writer 50 receives a high-voltage (approximately 20 V) carrier signal that is load-modulated in accordance with response information at the transponder, performs quadrature detection, and detects the response information as a result of the detection.

The reader/writer 50 includes an antenna 51, a modulation adjusting unit 52, and an IQ detecting unit 53.

The antenna 51 receives a load-modulated carrier signal, and outputs the carrier signal to the modulation adjusting unit 52. The modulation adjusting unit 52 attenuates Vpp of the load-modulated carrier signal, and outputs the carrier signal to the IQ detecting unit 53, while maintaining the amplitude change components of the load-modulated carrier signal, as shown in FIG. 8. The IQ detecting unit 53 performs quadrature detection (IQ detection) on the carrier signal input from the modulation adjusting unit 52, and detects response information as a result of the detection.

Example Structure of the Modulation Adjusting Unit 52

Figure 10:
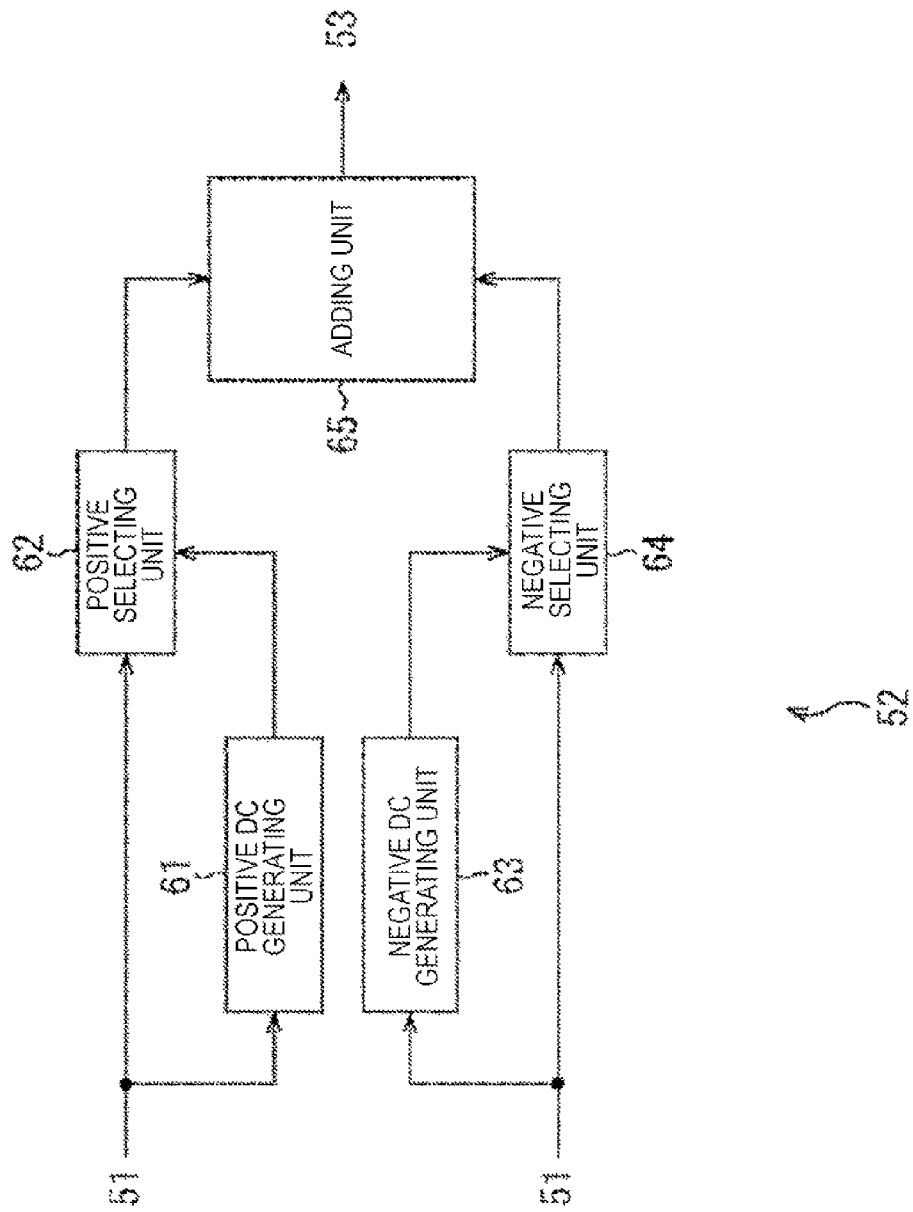
FIG. 10 is a block diagram showing an example structure of the modulation adjusting unit.

FIG. 10 shows an example structure of the modulation adjusting unit 52. The modulation adjusting unit 52 includes a positive DC generating unit 61, a positive selecting unit 62, a negative DC generating unit 63, a negative selecting unit 64, and an adding unit 65.

Based on a load-modulated carrier signal that is input from the antenna 51, the positive DC generating unit 61 generates a positive threshold that is the positive DC component (a fixed value) of the voltage of the load-modulated carrier signal, and outputs the positive threshold to the positive selecting unit 62. Specifically, the positive threshold for extracting the waveform shown in the upper portion of B in FIG. 8 is generated from the load-modulated carrier signal shown in A in FIG. 8, for example.

The positive selecting unit 62 compares the voltage of the load-modulated carrier signal input from the antenna 51 with the value of the positive DC component (the positive threshold) input from the positive DC generating unit 61, and outputs the larger value to the adding unit 65. As a result of this selection, the positive amplitude fluctuation portion of the voltage of the carrier signal is extracted as shown in the upper portion of B of FIG. 8, for example.

Based on the load-modulated carrier signal that is input from the antenna 51, the negative DC generating unit 63 generates a negative threshold that is the negative DC component (a fixed value) of the voltage of the load-modulated carrier signal, and outputs the negative threshold to the negative selecting unit 64. Specifically, the negative threshold for extracting the waveform shown in the lower portion of B in FIG. 8 is generated from the load-modulated carrier signal shown in A in FIG. 8, for example.

The negative selecting unit 64 compares the voltage of the load-modulated carrier signal input from the antenna 51 with the value of the negative DC component (the negative threshold) input from the negative DC generating unit 62, and outputs the smaller value to the adding unit 65. As a result of this selection, the negative amplitude fluctuation portion of the voltage of the carrier signal is extracted as shown in the lower portion of B of FIG. 8, for example.

The adding unit 65 adds the output of the positive selecting unit 62 and the output of the negative selecting unit 64, and outputs the addition result (FIG. 12c) to the IQ detecting unit 53. As the addition result, a signal that has a lower Vpp than that of the original carrier signal and maintains the fluctuation portions of the voltage is obtained as shown in C in FIG. 8, for example.

First Example Structure of an Electronic Circuit that Realizes the Modulation Adjusting Unit 52

Figure 11:
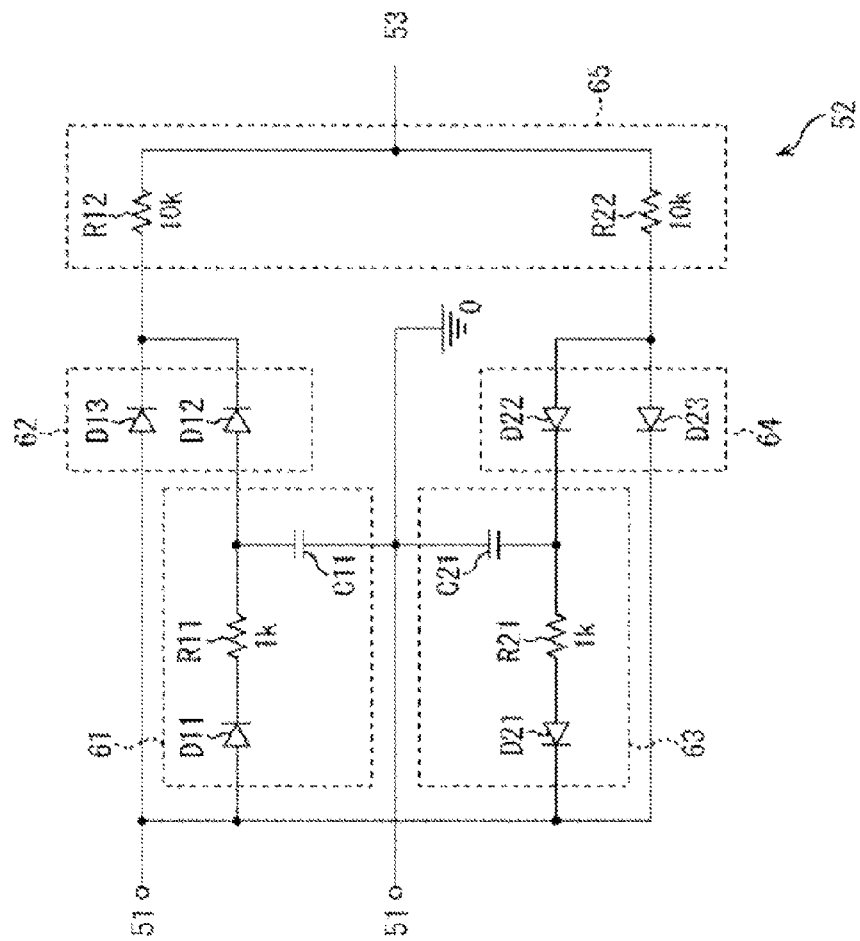
FIG. 11 is a block diagram showing a first example structure of an electronic circuit that realizes the modulation adjusting unit.

FIG. 11 shows a first example structure of an electronic circuit that realizes the modulation adjusting unit 52. It should be noted that the components equivalent to those in FIG. 10 are denoted by the same reference numerals as those used in FIG. 10.

In FIG. 11, the positive DC generating unit 61 is formed with a diode D11, a resistor R11, and a capacitor C11. The diode D11 passes only the positive voltage of a carrier signal that is input from the antenna 51 connected to the anode side. Accordingly, a positive voltage is applied to the capacitor C11. The resistor R11 prevents excess current from flowing into the capacitor C11. Accordingly, the value of the voltage accumulated in the capacitor C11 can be adjusted by changing the value of the resistor R11.

The positive selecting unit 62 is formed with a diode D12 and a diode D13 that are connected in parallel. The positive voltage from the capacitor C11 connected to the anode side is applied to the diode D12. The positive voltage of the carrier signal from antenna 51 connected to the anode side is applied to the diode D13. As a result, the positive voltage accumulated in the capacitor C11 or the positive voltage of the carrier signal, whichever is higher, is output to the adding unit 65 of a later stage.

The negative DC generating unit 63 is formed with a diode D21, a resistor R21, and a capacitor C21. The diode D21 passes only the negative voltage of the carrier signal that is input from the antenna 51 connected to the cathode side. Accordingly, a negative voltage is applied to the capacitor C21. The resistor R21 prevents excess current from flowing into the capacitor C21. Accordingly, the value of the voltage accumulated in the capacitor C21 can be adjusted by changing the value of the resistor R21.

The negative selecting unit 64 is formed with a diode D22 and a diode D23 that are connected in parallel. The negative voltage from the capacitor C21 connected to the cathode side is applied to the diode D22. The negative voltage of the carrier signal from antenna 51 connected to the cathode side is applied to the diode D23. As a result, the negative voltage accumulated in the capacitor C21 or the negative voltage of the carrier signal, whichever is lower, is output to the adding unit 65 of a later stage.

The adding unit 65 is formed with a resistor R12 and a resistor R22.

Figure 12:
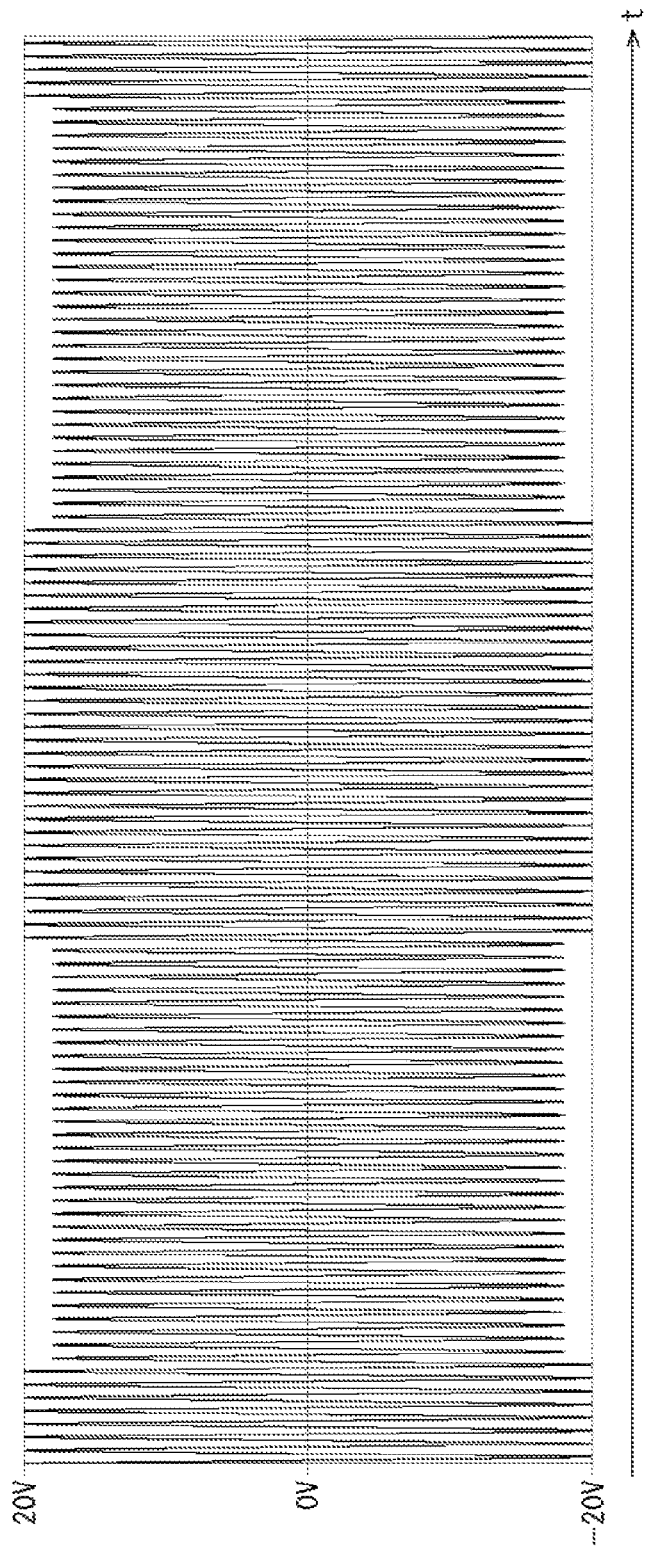
FIG. 12 is a diagram showing a load-modulated carrier signal that is input to the first example structure of the modulation adjusting unit.
Figure 13:
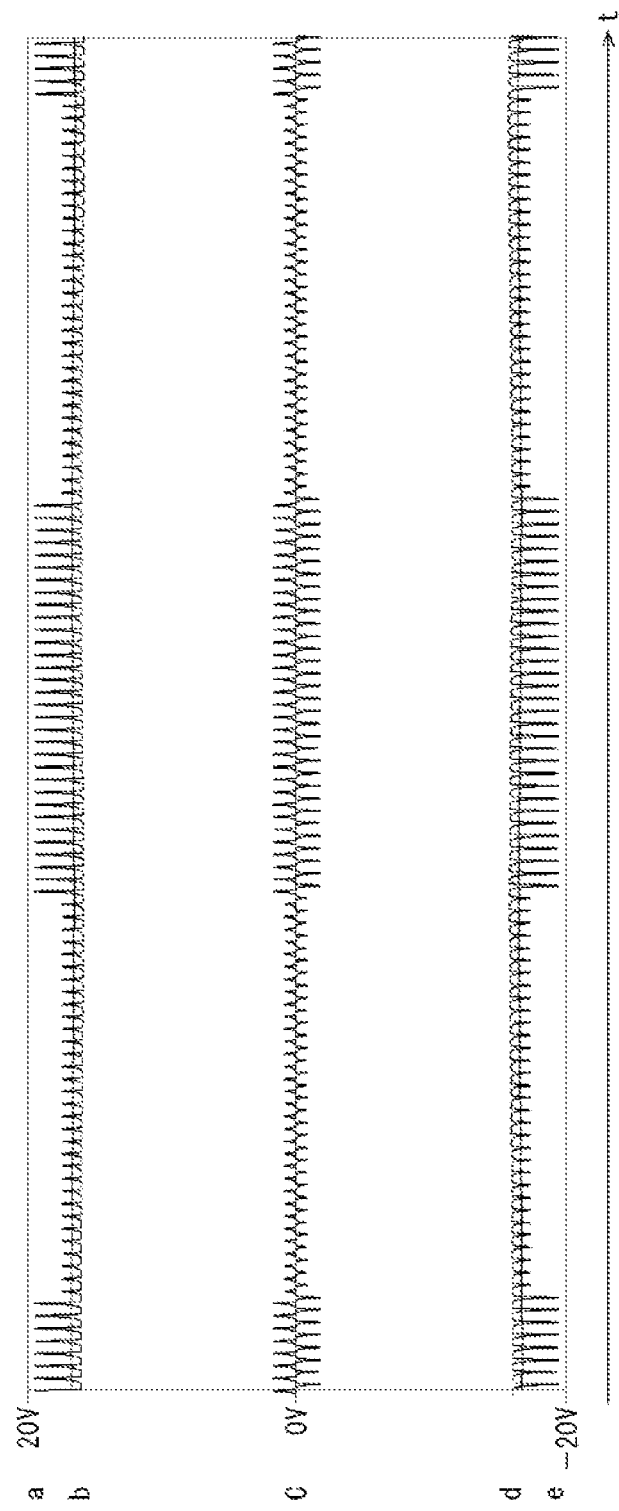
FIG. 13 is a diagram showing the signal waveforms at respective parts of the first example structure of the modulation adjusting unit.

When a load-modulated carrier signal having Vpp=40 V as shown in FIG. 12 is input to the first example structure of the modulation adjusting unit 52 shown in FIG. 11, the positive DC generating unit 61 can obtain a positive fixed value (a threshold) as shown in FIG. 13b. The positive threshold can be adjusted by changing the value of the resistor R11. The positive selecting unit 62 extracts the higher portion than the positive threshold shown in FIG. 13b from the carrier signal, and obtains a signal having the waveform shown in FIG. 13a.

Meanwhile, the negative DC generating unit 63 can obtain a negative fixed value (a threshold) as shown in FIG. 13d. The negative threshold can be adjusted by changing the value of the resistor R21. The negative selecting unit 64 extracts the lower portion than the negative threshold shown in FIG. 13d from the carrier signal, and obtains a signal having the waveform shown in FIG. 13e.

The adding unit 65 adds the waveform shown in FIG. 13a and the waveform shown in FIG. 13e, to obtain a signal having the waveform shown in FIG. 13c. The signal is output to a later stage.

Figure 14:
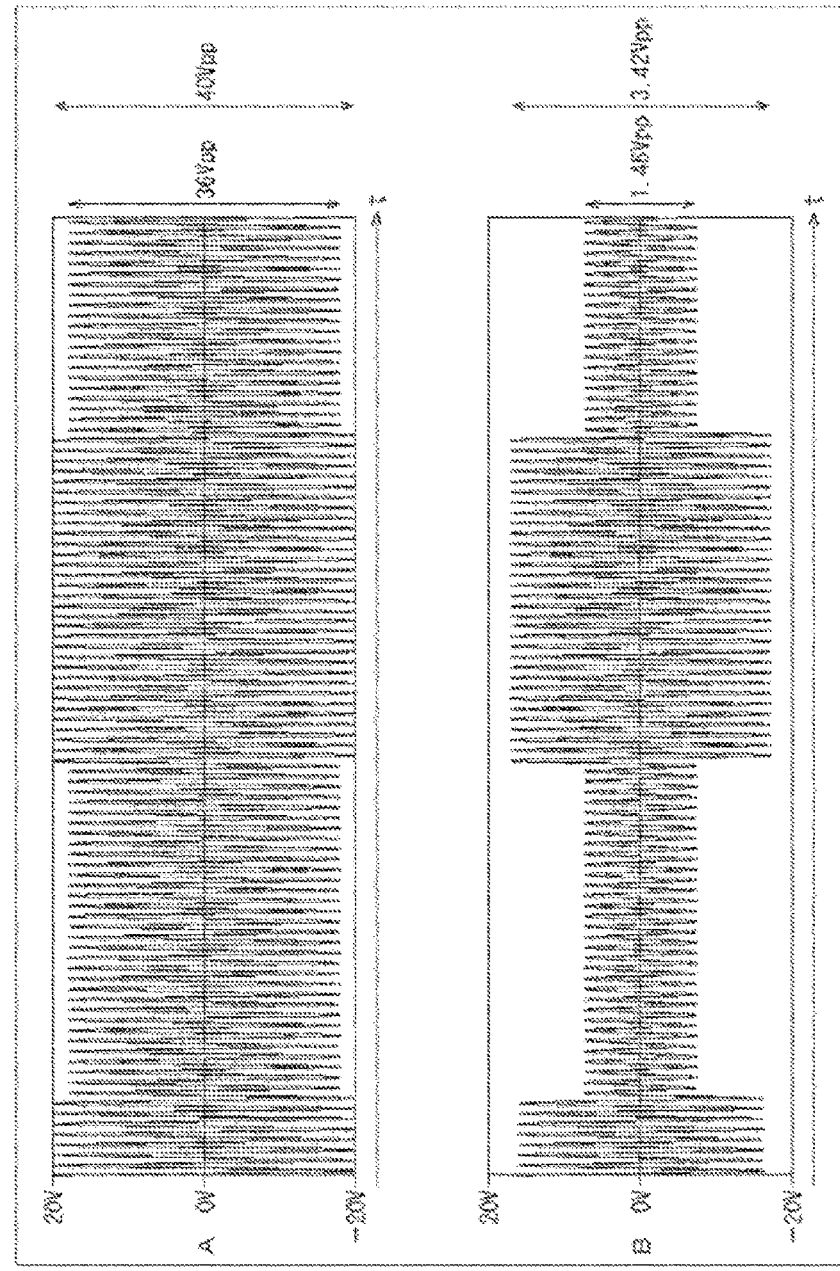
FIG. 14 is a diagram showing the Vpp reduction effect achieved by the first example structure of the modulation adjusting unit.
Figure 15:
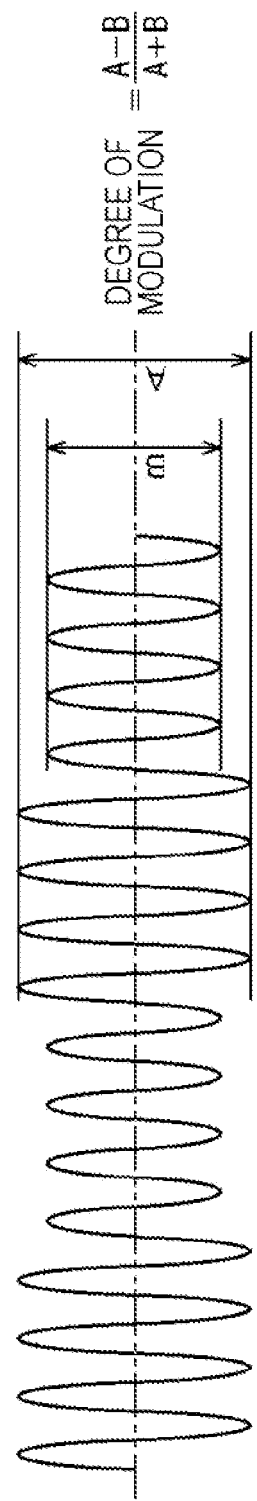
FIG. 15 is a diagram showing a definition of a degree of modulation.

FIG. 14 shows the waveform of the voltage of the carrier signal that is shown in FIG. 12 and is input to the first example structure of the modulation adjusting unit 52, and the waveform of the voltage that is shown in FIG. 13c and is output from the adding unit 65, with the widths of the waveforms being adjusted. Specifically, the ordinate axis in A in FIG. 14 indicates the ±20 V range, and the ordinate axis in B in FIG. 14 indicates the ±2 V range. FIG. 15 shows a definition of a degree of modulation of a load-modulated signal. A degree of modulation is calculated by (A−B)/(A+B), which uses the maximum Vpp A and the minimum Vpp B.

As is apparent from FIG. 14, the maximum Vpp A of the carrier signal input to the first example structure of the modulation adjusting unit 52 is 40 V, and the minimum Vpp B is 36 V. Accordingly, the degree of modulation is 5.3%. On the other hand, the maximum Vpp A of the signal output from the adding unit 65 is 3.42 V, and the minimum Vpp B is 1.46 V. Accordingly, the degree of modulation is 40.2%.

With the first example structure of the modulation adjusting unit 52 shown in FIG. 11, the degree of modulation can be made approximately 7.5 times higher, while Vpp of the carrier signal is reduced. Thus, a quadrature detection LSI having 2 V as the highest allowable Vpp can be used in the IQ detecting unit 53, and furthermore, detection based on amplitude changes in the voltage of the carrier signal can be performed.

Operation by the Reader/Writer 50

Figure 16:
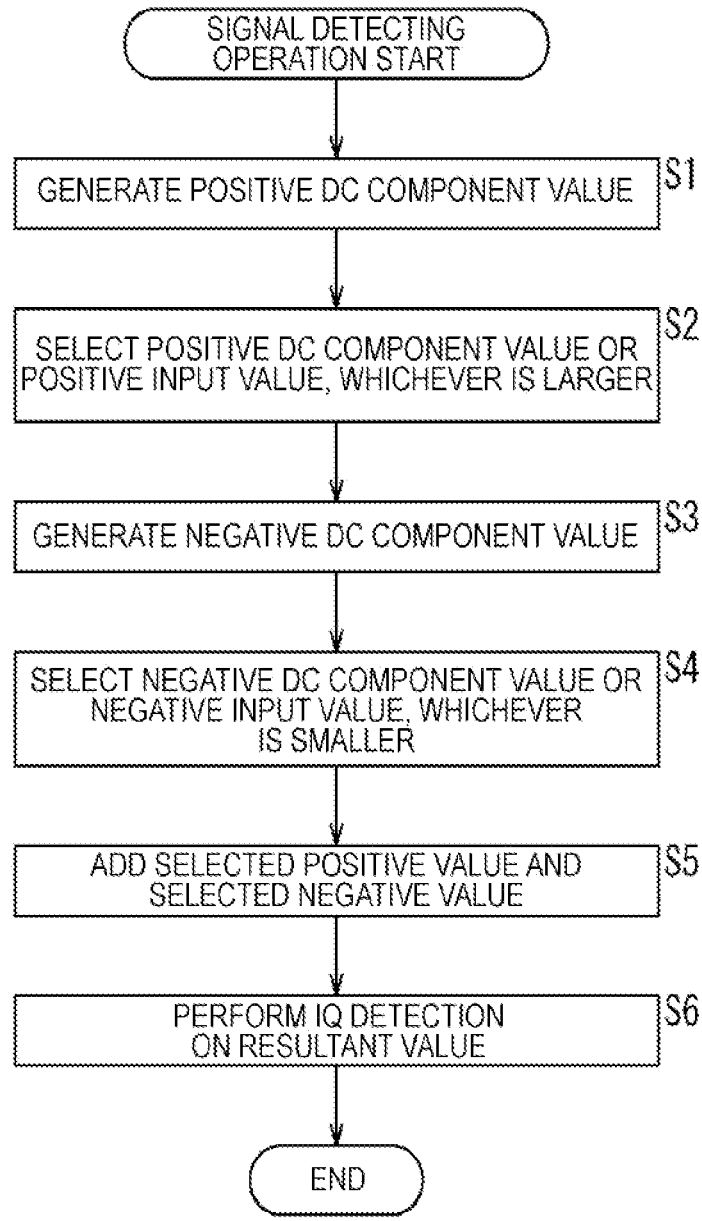
FIG. 16 is a flowchart for explaining a signal detecting operation to be performed by the reader/writer.

FIG. 16 is a flowchart for explaining a signal detecting operation to be performed by the reader/writer 50.

This signal detecting operation is performs on the assumption that a carrier signal load-modulated by the transponder is received by the antenna 51 of the reader/writer 50, and is input to the modulation adjusting unit 52.

In step S1, the positive DC generating unit 61 of the modulation adjusting unit 52 generates a positive threshold based on the carrier signal input from the antenna 51, and outputs the positive threshold to the positive selecting unit 62. In step S2, the positive selecting unit 62 compares the voltage of the carrier signal input from the antenna 51 with the positive threshold from the positive DC generating unit 61, and outputs the value of the larger one to the adding unit 65.

In step S3, the negative DC generating unit 63 generates a negative threshold based on the carrier signal input from the antenna 51, and outputs the negative threshold to the negative selecting unit 64. In step S4, the negative selecting unit 64 compares the voltage of the carrier signal input from the antenna 51 with the negative threshold input from the negative DC generating unit 62, and outputs the value of the smaller one to the adding unit 65.

The procedures of steps S1 through S4 are simultaneously carried out in practice.

In step S5, the adding unit 65 adds the output of the positive selecting unit 62 and the output of the negative selecting unit 64, and outputs the addition result (FIG. 12c) to the IQ detecting unit 53. In step S6, the IQ detecting unit 53 performs IQ detection on the signal that is input from the adding unit 65, has a lower Vpp than that of the original carrier signal, and maintains the fluctuation portions of voltage. As a result of the IQ detection, response information from the transponder can be obtained. The signal detecting operation is thus completed.

Second Example Structure of an Electronic Circuit that Realizes the Modulation Adjusting Unit 52

Figure 17:
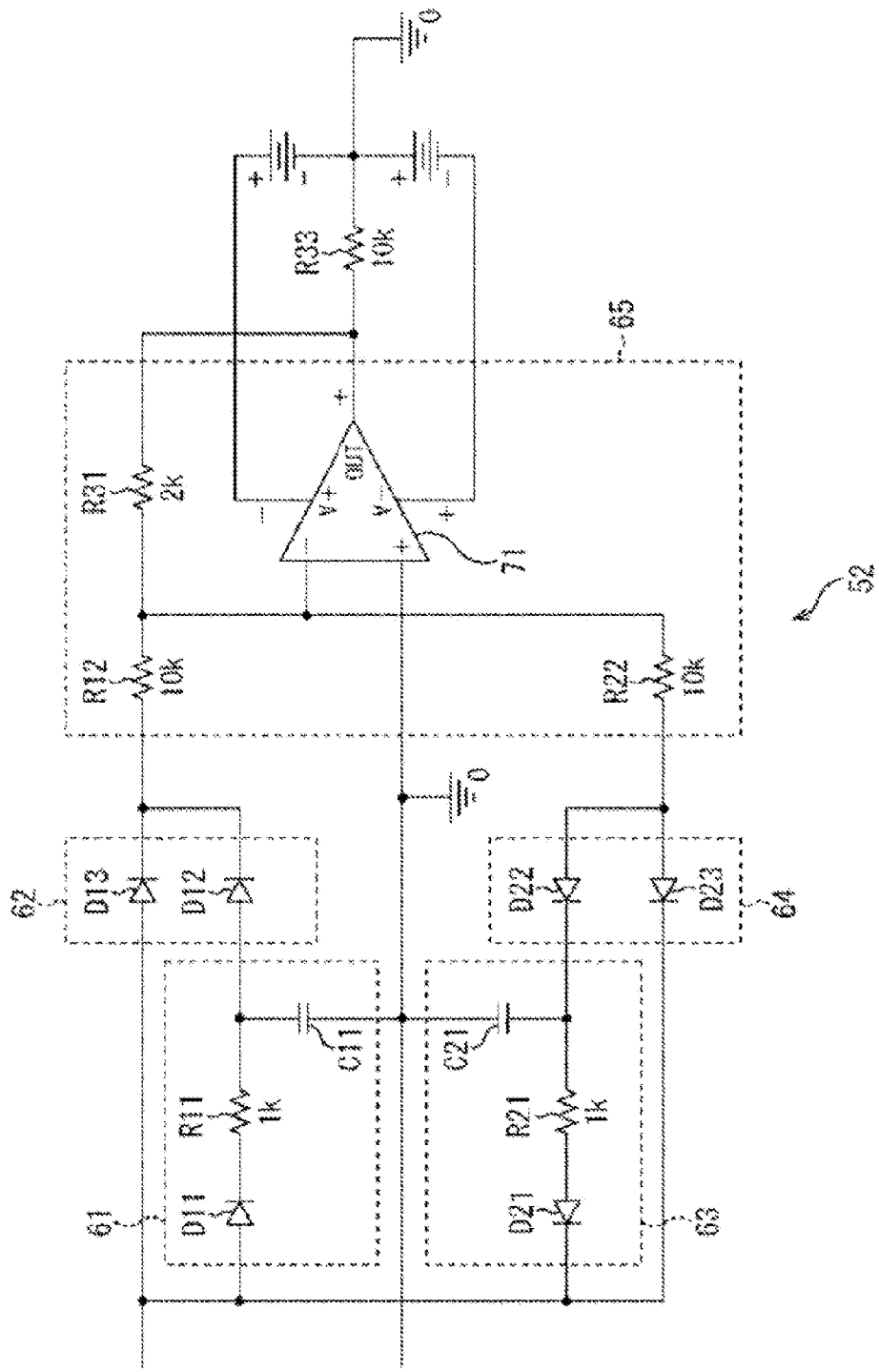
FIG. 17 is a block diagram showing a second example structure of an electronic circuit that realizes the modulation adjusting unit.

FIG. 17 shows a second example structure of an electronic circuit that realizes the modulation adjusting unit 52. The same components as those of the first example structure shown in FIG. 11 are denoted by the same reference numerals and characters as those used in FIG. 11, and therefore, explanation of them will not be repeated.

The second example structure differs from the first example structure in the structure of the adding unit 65. Specifically, the adding unit 65 is formed with the resistor R12 and the resistor R22 in the first example structure, but the second example structure further includes a resistor R31 and an operational amplifier 71.

The resistor R31 has a smaller resistance value than that of the resistor R12 and the resistor R22, and functions as a feedback resistance for the operational amplifier 71. The operational amplifier 71 attenuates the sum of the output of the positive selecting unit 62 that is input via the resistor R12, and the output of the negative selecting unit 64 that is input via the resistor R22. The attenuated value is output to a later stage.

Figure 18:
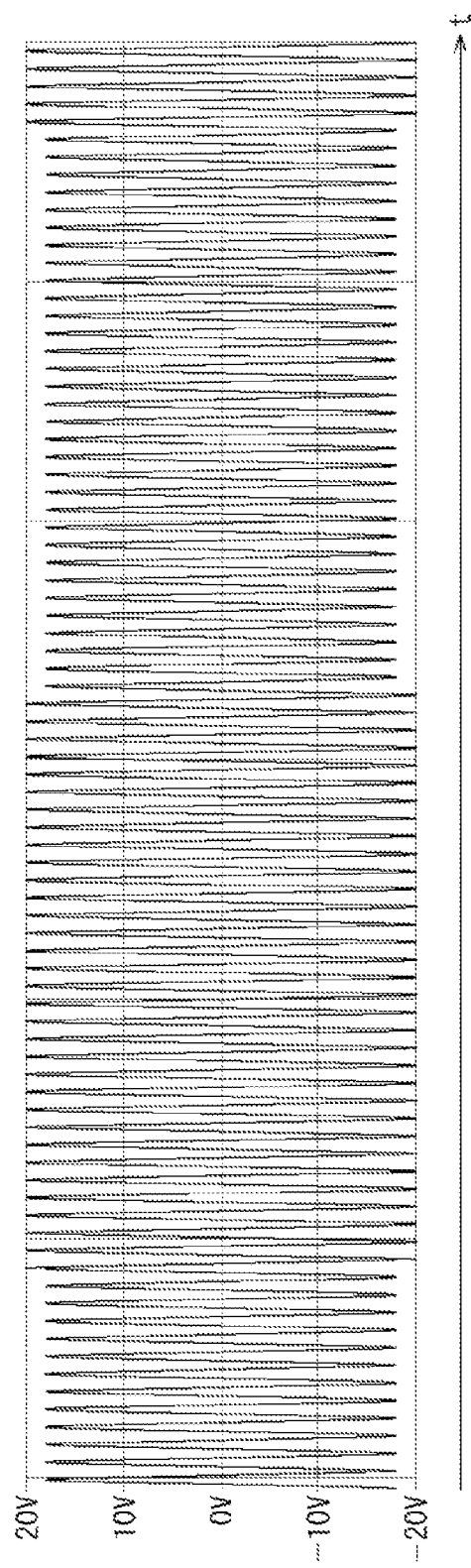
FIG. 18 is a diagram showing a load-modulated carrier signal that is input to the second example structure of the modulation adjusting unit.
Figure 19:
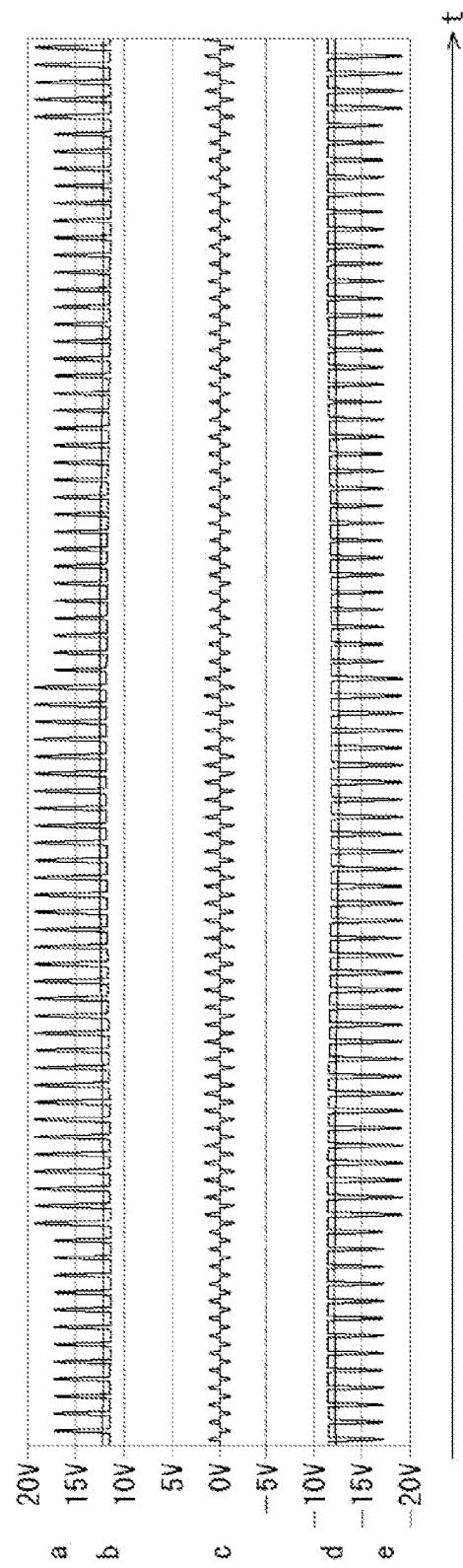
FIG. 19 is a diagram showing the signal waveforms at respective parts of the second example structure of the modulation adjusting unit.

When a load-modulated carrier signal having Vpp=40 V as shown in FIG. 18 is input to the second example structure of the modulation adjusting unit 52 shown in FIG. 17, the positive DC generating unit 61 can obtain a positive fixed value (a positive threshold) as shown in FIG. 19b. The positive threshold can be adjusted by changing the value of the resistor R11. The positive selecting unit 62 extracts the portion exceeding the positive threshold shown in FIG. 19b from the carrier signal, and obtains a signal having the waveform shown in FIG. 19a.

Meanwhile, the negative DC generating unit 63 can obtain a negative fixed value (a negative threshold) as shown in FIG. 19d. The negative threshold can be adjusted by changing the value of the resistor R21. The negative selecting unit 64 extracts the portion lower than the negative threshold shown in FIG. 19d from the carrier signal, and obtains a signal having the waveform shown in FIG. 19e.

The adding unit 65 adds the waveform shown in FIG. 19a and the waveform shown in FIG. 19e, to obtain a signal having the waveform shown in FIG. 19c. The signal is output to a later stage.

Figure 20:
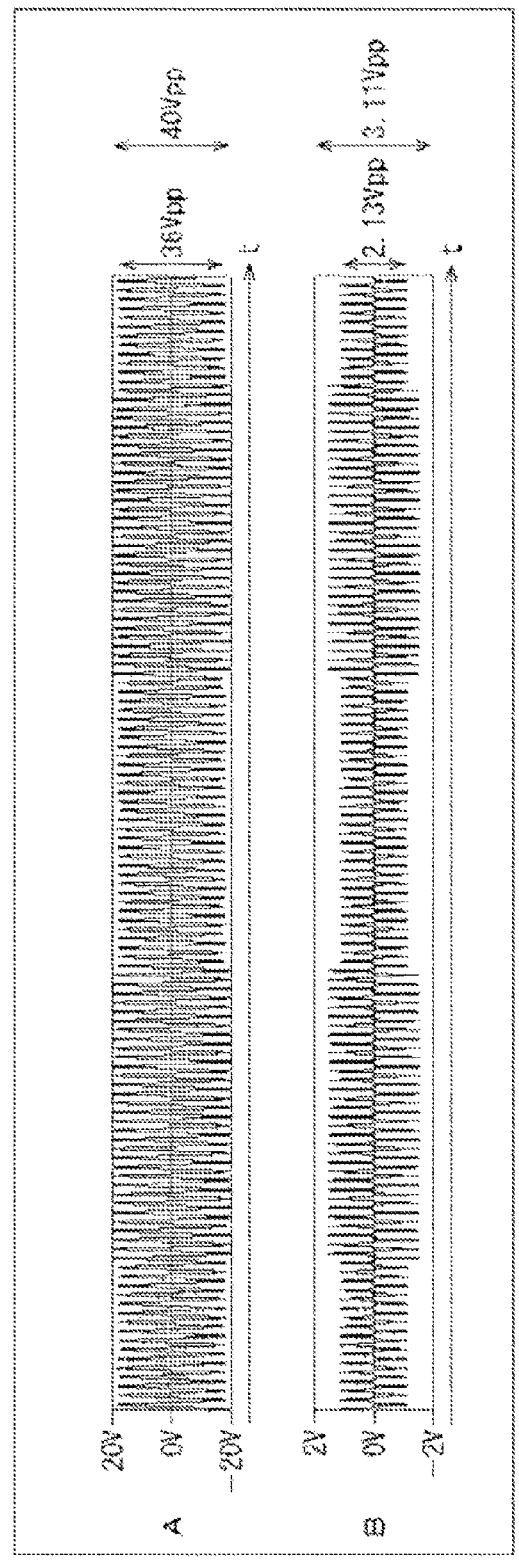
FIG. 20 is a diagram showing the Vpp reduction effect achieved by the second example structure of the modulation adjusting unit.

FIG. 20 shows the waveform of the voltage of the carrier signal that is shown in FIG. 18 and is input to the second example structure of the modulation adjusting unit 52, and the waveform of the voltage that is shown in FIG. 19c and is output from the adding unit 65, with the widths of the waveforms being adjusted. Specifically, the ordinate axis in A in FIG. 20 indicates the ±20 V range, and the ordinate axis in B in FIG. 20 indicates the ±2 V range.

As is apparent from FIG. 20, the maximum Vpp A of the carrier signal input to the second example structure of the modulation adjusting unit 52 is 40 V, and the minimum Vpp B is 36 V. Accordingly, the degree of modulation is 5.3%. On the other hand, the maximum Vpp A of the signal output from the adding unit 65 is 3.11 V, and the minimum Vpp B is 2.13 V. Accordingly, the degree of modulation is 18.7%.

With the second example structure of the modulation adjusting unit 52 shown in FIG. 17, the degree of modulation can be made approximately 3.5 times higher, while Vpp of the carrier signal is reduced. Thus, a quadrature detection LSI having 2 V as the highest allowable Vpp can be used in the IQ detecting unit 53, and furthermore, detection based on amplitude changes in the voltage of the carrier signal can be performed.

Another Example Structure of the Reader/Writer

Figure 21:
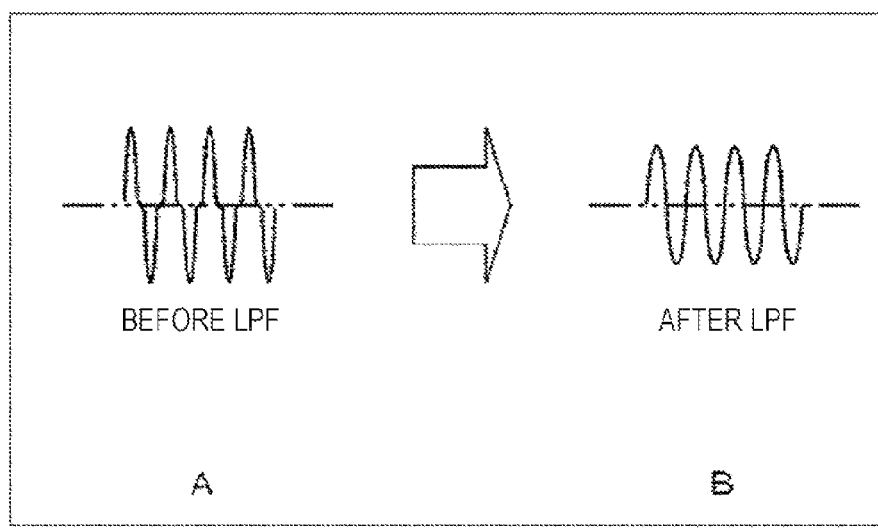
FIG. 21 is a diagram showing waveforms output from the modulation adjusting unit.

The voltage of a carrier signal attenuated by the above described modulation adjusting unit 52 has the waveform shown in A of FIG. 21. This carrier signal may be input to the IQ detecting unit 53, and is subjected to detection. However, detection accuracy can be further increased, if the waveform is shaped into a waveform similar to a sinusoidal wave as shown in B of FIG. 21.

Figure 22:
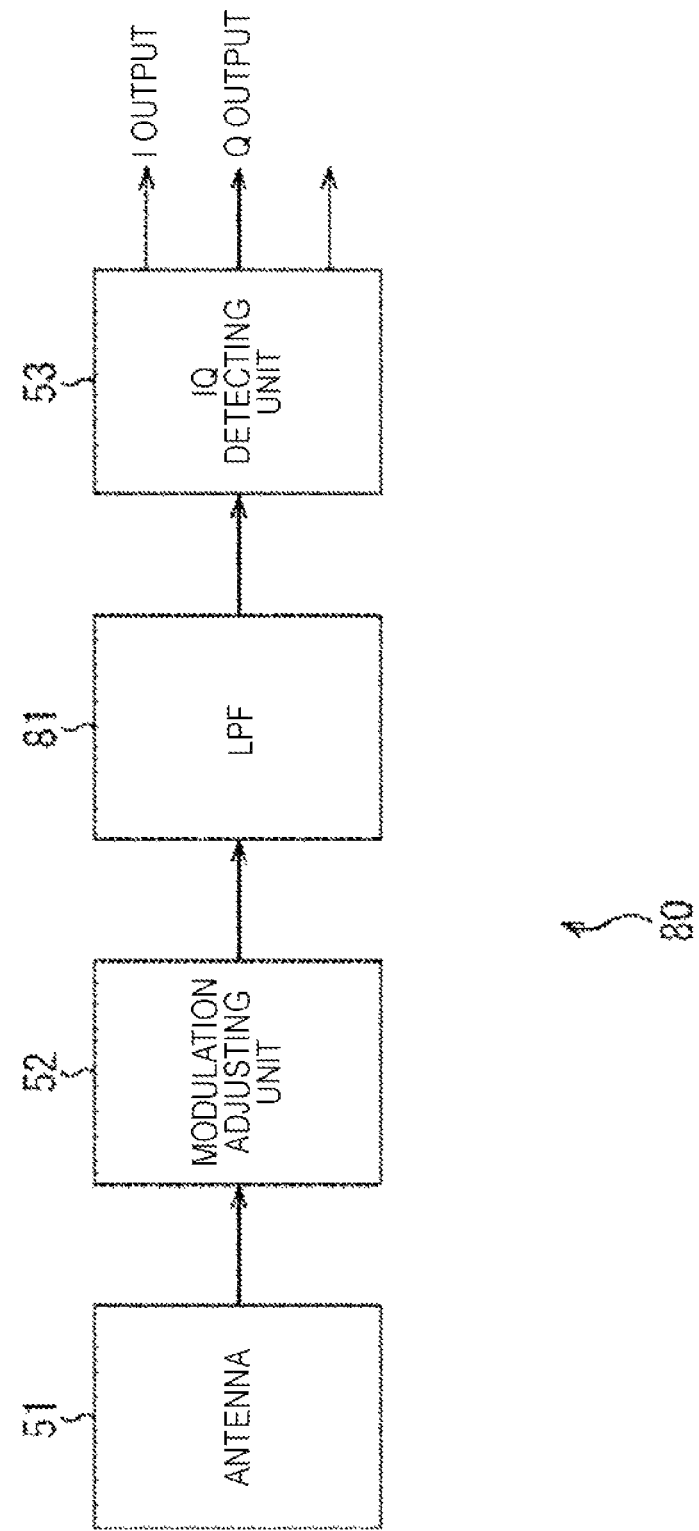
FIG. 22 is a block diagram showing another example structure of the reader/writer.

FIG. 22 shows an example structure of a reader/writer 80 that can shape the waveform of the attenuated carrier signal into a waveform similar to a sinusoidal wave as described above, and input the carrier signal with the shaped waveform to the IQ detecting unit 53.

The reader/writer 80 is the same as the reader/writer 50 shown in FIG. 9, except that a LPF 81 is provided between the modulation adjusting unit 52 and the IQ detecting unit 53. Other than the LPF 81, the components are the same as those of the reader/writer 50. The LPF 81 can make the waveform of the attenuated carrier signal similar to a sinusoidal wave by removing the high-frequency components of the attenuated carrier signal.

With the reader/writer 80, response information can be detected with a higher degree of accuracy than that with the reader/writer 50.

Having the modulation adjusting unit 52, each of the above described readers/writers 50 and 80 is very effective in detecting amplitude fluctuations in the voltage of a carrier signal. In a case where the distance between the reader/writer and the transponder is relatively long, load modulation is more often detected as an amplitude change than as a phase change. Therefore, this disclosure is particularly effective in extending the communication distance between the reader/writer and the transponder.

The modulation adjusting unit 52 of this disclosure can be used not only in the reader/writer of a non-contact communication system, but also in a receiving device that receives load-modulated signals.

In this specification, a "system" means an entire apparatus formed with more than one device.

It should be noted that embodiments of this disclosure are not limited to the above described embodiments, and various modifications may be made to them without departing from the scope of this disclosure.

REFERENCE SIGNS LIST

50 Reader/writer, 51 Antenna, 52 Modulation adjusting unit, 53 IQ detecting unit, 61 Positive DC generating unit, 62 Positive selecting unit, 63 Negative DC generating unit, 64 Negative selecting unit, 65 Adding unit, 80 Reader/writer, 81 LPF

The invention claimed is:
1. A signal processing device, comprising:
a modulation generating unit configured to generate a positive threshold value and a negative threshold value based on an amplitude shift keying (ASK)-modulated carrier signal;
a positive detecting unit configured to compare voltage the ASK-modulated carrier signal with the generated positive threshold value, and detect a first value of the voltage which is higher than the positive threshold value as a positive amplitude fluctuation portion;
a negative detecting unit configured to compare the voltage of the ASK-modulated carrier signal with the generated negative threshold value, and detect a second value of the voltage which is lower than the negative threshold value as a negative amplitude fluctuation portion; and an adding unit configured to add the positive amplitude fluctuation portion and the negative amplitude fluctuation portion of the voltage of the ASK-modulated carrier signal.

2. The signal processing device according to claim 1, further comprising
a shaping unit configured to shape a waveform that results from addition of the positive amplitude fluctuation portion and the negative amplitude fluctuation portion into a sinusoidal wave.

3. A signal processing method, comprising:
in a signal processing device configured to attenuate a voltage of an amplitude shift keying (ASK)-modulated carrier signal:
generating a positive threshold value and a negative threshold value using the ASK-modulated carrier signal;
comparing the voltage of the ASK-modulated carrier signal with the generated positive threshold value;
detecting a first value of the voltage which is higher than the positive threshold value as a positive amplitude fluctuation portion;
comparing the voltage of the ASK-modulated carrier signal with the generated negative threshold value;
detecting a second value of the voltage which is lower than the negative threshold value as a negative amplitude fluctuation portion; and
adding the positive amplitude fluctuation portion and the negative amplitude fluctuation portion of the voltage of the ASK-modulated carrier signal.

4. A receiving device, comprising:
a receiving unit configured to receive an amplitude shift keying (ASK)-modulated carrier signal;
a modulation generating unit configured to generate a positive threshold value and a negative threshold value based on the received ASK-modulated carrier signal;
a positive detecting unit configured to compare a voltage of the ASK-modulated carrier signal with the generated positive threshold value, and detect a first value of the voltage which is higher than the positive threshold value as a positive amplitude fluctuation portion;
a negative detecting unit configured to compare the voltage of the ASK-modulated carrier signal with the generated negative threshold value, and detect a second value of the voltage which is lower than the negative threshold value as a negative amplitude fluctuation portion;
an adding unit configured to add the positive amplitude fluctuation portion and the negative amplitude fluctuation portion of the voltage of the ASK-modulated carrier signal; and
a detecting unit configured to detect a result of addition of the positive amplitude fluctuation portion and the negative amplitude fluctuation portion.

5. The receiving device according to claim 4, further comprising a shaping unit configured to shape a waveform that results from addition of the positive amplitude fluctuation portion and the negative amplitude fluctuation portion into a sinusoidal wave,
wherein the detecting unit is further configured to detect the shaped sinusoidal wave.

6. The receiving device according to claim 4, wherein the detecting unit is further configured to detect response information included in the ASK-modulated carrier signal based on quadrature detection on the result of addition of the positive amplitude fluctuation portion and the negative amplitude fluctuation portion.

* * * * *